United States Patent [19]

Bernardo

[11] 4,025,380
[45] May 24, 1977

[54] VARIABLE RESIST LAMINATOR

[75] Inventor: Edward Thomas Bernardo, Endicott, N.Y.

[73] Assignee: International Business Machines Corporation, Armonk, N.Y.

[22] Filed: July 24, 1975

[21] Appl. No.: 598,905

[52] U.S. Cl. .............................. 156/355; 156/361; 156/497; 156/511; 156/522; 156/555
[51] Int. Cl.² .................. B26D 5/28; B65H 17/28
[58] Field of Search .......... 156/511, 522, 521, 555, 156/517, 516, 285, 497, 353, 355, 361; 83/60, 359, 487, 488

[56] References Cited

UNITED STATES PATENTS

| | | | |
|---|---|---|---|
| 1,292,119 | 1/1919 | Staley | 156/353 |
| 2,004,657 | 6/1935 | Gerard | 156/516 |
| 2,538,520 | 1/1951 | Holt, Jr. et al. | 156/497 |
| 2,776,068 | 1/1957 | Johnson | 156/353 |
| 2,818,908 | 1/1958 | Byrnes et al. | 156/522 |
| 3,574,040 | 4/1971 | Chitwood et al. | 156/522 |
| 3,674,590 | 4/1972 | Holman | 156/522 |
| 3,816,215 | 6/1974 | Wethington | 156/522 |
| 3,954,550 | 5/1976 | Patterson | 156/522 |

Primary Examiner—Charles E. Van Horn
Assistant Examiner—M. G. Wityshyn
Attorney, Agent, or Firm—Gerald R. Gugger

[57] ABSTRACT

The variable resist laminator receives a heated panel between two identical vacuum bails and the leading edge of a web of photoresist material is placed on opposite sides of the panel simultaneously prior to feeding the panel and attached webs between a pair of application rolls. Identical cutter mechanisms shear the webs into sheets of the desired length and the length may be varied for different length panels. Vacuum means are provided for maintaining control of the trailing edges of the cut sheets until they are applied to the panel to prevent the formation of wrinkles or other defects due to premature application. Vacuum means is also provided for removing flakes or debris as the webs are sheared. A gated conveyor system feeds the panels and the conveyor system has means for controlling the operation of the vacuum bails, the cutters, and the application rolls.

4 Claims, 4 Drawing Figures

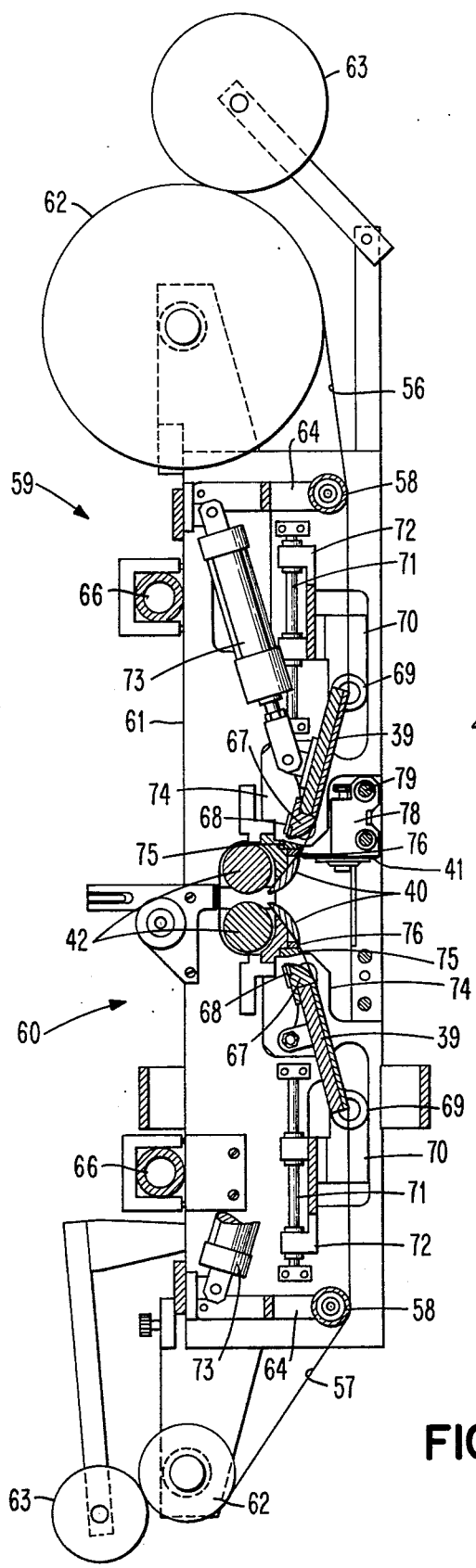
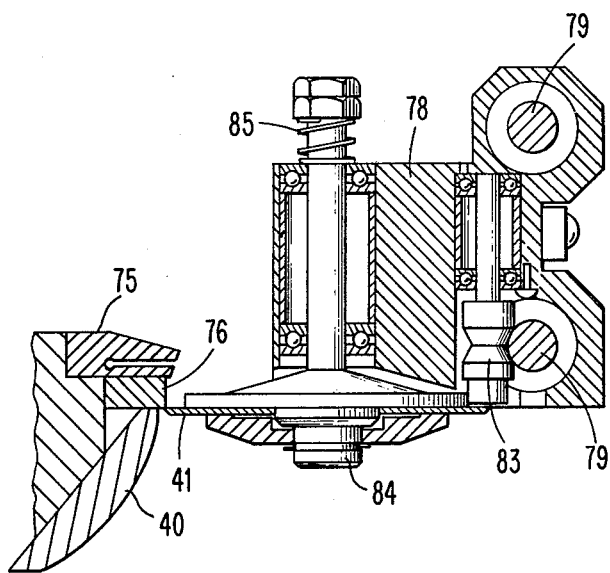
FIG. 3
FIG. 4

VARIABLE RESIST LAMINATOR

BACKGROUND OF THE INVENTION

Laminators for securing sheets of resist material simultaneously to opposite sides of a panel are known in the art but these machines only were able to select the width ahead of time by cutting the rolls to the desired dimension. The sheet material was drawn from the rolls and laminated to both sides of a plurality of panels being fed in sequence between the two sheets of resist material. In this manner, the individual panels would be connected together by a finite length of resist material thereby stringing the panels together like link-sausages. It was then necessary to cut the individual panels apart and perform time-consuming and costly trimming operations.

To overcome the above problem, an improved laminator was introduced of the type described in U.S. Pat. No. 3,658,629. This laminator will cut sheets of resist and laminate them to panels within a defined perimeter. As the sheet of resist material is fed from the roll to the drum, a vacuum will hold the resist material in place on the surface of the drum and a cutter will operate at predetermined locations on the drum to cut the sheets into the desired individual length for application to the individual panels. The leading edge only of each sheet of resist material is pressure sealed to the leading edge of the board by means of opposed pressure strips located on the opposed drums. The pressure securement of the leading edge of the film is sufficient to pull the remaining portion of the sheet from the vacuum applied to the interior of the drum and will properly orient the sheets on the opposite sides of the panel for feeding into heating rolls for permanently securing the pre-cut sheets of resist material to opposite sides of the panel. Although this mode of operation overcame the link-sausage problem, it was found that there was insufficient control of the trailing edge of the resist sheet as it left the drum. The trailing edge of the sheet would drop onto the panel and immediately stick prior to being rolled out and as a result, film wrinkling occured. Also, it was found that the cutter mechanism would leave flakes or debris which would cause defects in the resist covered panels. Another disadvantage was that there was a lack of versatility in that the machine would handle only a fixed-size panel to which was applied a fixed-size piece of film. This type of machine also had high maintenance costs.

SUMMARY OF THE INVENTION

The present invention provides an improved photoresist laminator which is more flexible, cleaner in operation, and wherein complete control is maintained of the trailing edge of the sheets. The individual panels are sequentially fed through the machine by belt conveyors and along the path of travel are positioned sensor switches which monitor the feed of the panels and they also monitor the operation of a pair of vacuum bails, a cutter mechanism, and a pair of apply rolls.

The panels are loaded onto the conveyor system by an indexing elevator and each panel passes first through a heating station where it is heated. The heated panel is then conveyed to a web attaching and cutting station. At this station there is provided an upper and a lower vacuum bail. These bails operate against the panel to attach only the leading edge of a web of resist to each side of the panel. The bails are retracted and the panel then passes between a pair of apply rolls which will close to seal the resist to the heated panel surfaces. As the panel passes between the rolls for a predetermined distance it will activate a sensor switch which will cause the apply rolls and panel to stop and a pair of rotating cutters will be operated to move across the machine and shear the webs into sheets which are precisely the size required. After cutting, the panel is fed on to an unload station and the apply rolls are again activated to seal the remaining portion of the resist sheets to the panel and then reopen.

The present laminator includes a number of features which provide for a greater degree of flexibility and improved operation. The conveyor system makes use of belts which are adjustable so that panels of varying widths can be processed and the position of the sensor switch that controls the cutters may be varied to vary the length of the cut sheets to any preset length and thus enable the processing of different length panels. Additionally, the use of the vacuum bails as opposed to drums makes it possible to process panels of varying thickness.

To obtain a clean cutting operation which will have no adverse effect on the resist material, each cutter rotates against the underside of a vacuum cutter bar which effectively removes any flakes or debris during the cutting of the webs.

It is essential that the trailing edge of the cut sheet be prevented from prematurely engaging the surface of the panel. To accomplish this, there is provided in close proximity to the panel surface an arcuate vacuum shoe over which the trailing edge of the sheet is drawn as it is being applied. The vacuum shoe maintains positive control of the trailing edge until it contacts the panel surface and thus prevents wrinkling of the sheet.

It is, then, a primary object of the present invention to provide an improved laminator for applying sheets of resist material to both sides of printed circuit panels.

A further object of the present invention is to provide an improved laminator for applying sheets of resist material to both sides of printed circuit panels and which has the flexibility to process panels of variable length, width, and thickness.

A still further object of the present invenion is to provide an improved laminator which cuts sheets from a web of material for application to panels and wherein means are provided for removing flakes or debris of material during the cutting operation.

Another object of the present invention is to provide an improved laminator for applying a sheet of film to both sides of a panel and wherein the length of film applied can be varied to any preset length.

A still further object of the present invention is to provide a laminator for applying a sheet of film to both sides of a panel which includes improved means for attaching the leading edge of a web of film to a panel, improved means for severing the attached web to provide a clean cut sheet, and improved means for controlling the trailing portion of the cut sheet during application to prevent wrinkling.

A further object of the present invention is to provide and improved laminator for applying film sheets to both sides of panels which includes a gated conveyor system for feeding the panels with the conveyor system having sensor means for controlling the operation of the laminator apparatus and conveyor system.

The foregoing and other objects, features and advantages of the invention will be apparent from the follow-

BRIEF DESCRIPTION OF THE DRAWINGS

FIG. 3 is a sectional view taken along line 3—3 of FIG. 2 and showing in detail the web applying and cutting mechanisms.

FIG. 4 is a side elevation view showing the cutter mechanism for shearing the web.

DESCRIPTION OF PREFERRED EMBODIMENT

The laminator according to the present invention is used in the processing of panels and boards of varying thicknesses from between 0.030 and 0.125 inches and of varying sizes from between 10 × 15 and 24 × 28 inches. The specific function of the laminator is to apply layers of photo resist material and protective layers of mylar to both sides of the panels being processed. However, the laminator could be employed for any application where a flexible material is to be applied to a rigid substrate.

Figure 1:
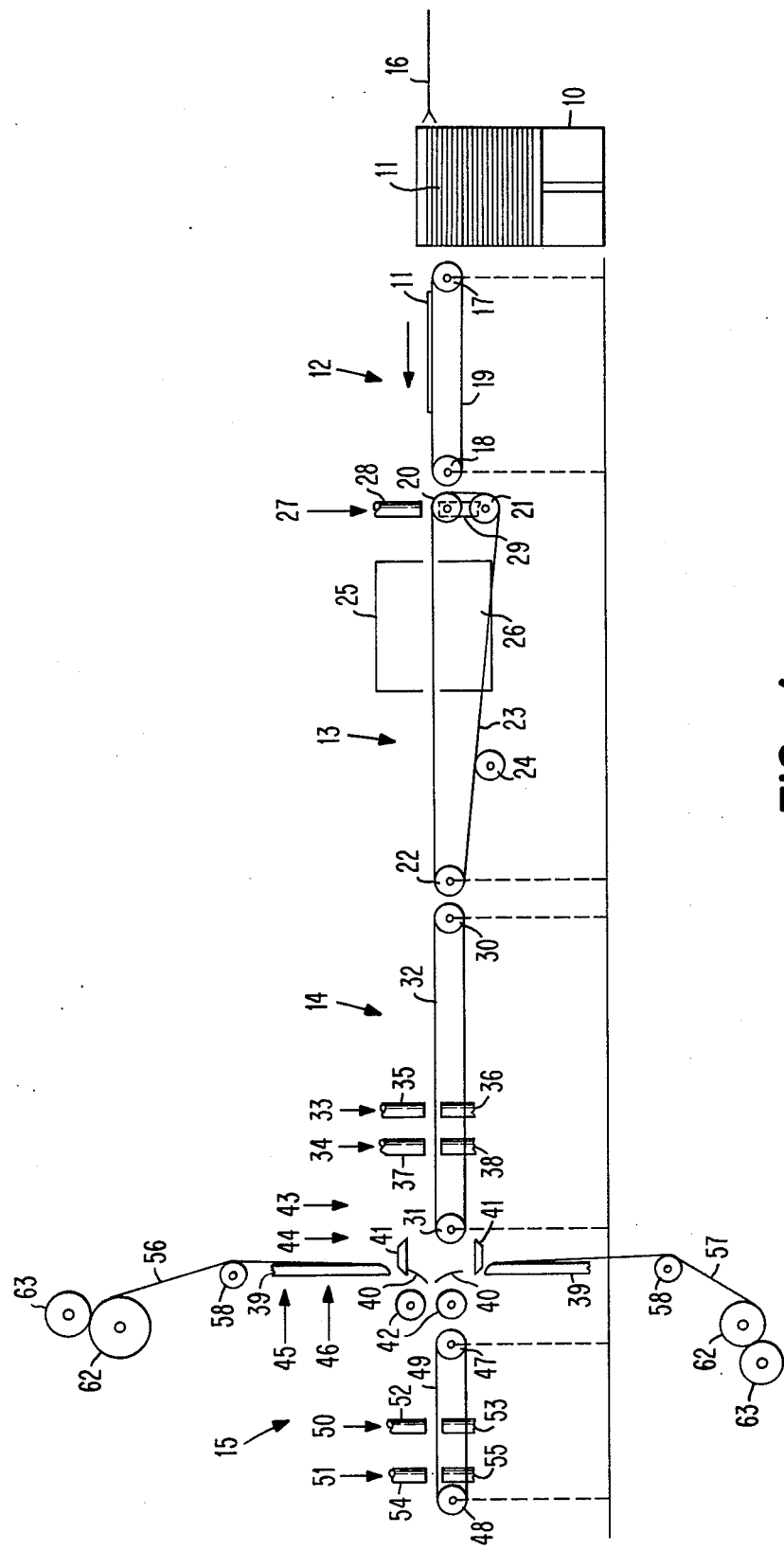
FIG. 1 is a schematic diagram showing the gated conveyor system for sequentially feeding panels through the laminator.

Referring to FIG. 1, there is shown schematically the gated conveyor system for transporting the panels through the laminator apparatus. The system comprises an input elevator 10 into which the panels 11 to be processed are stacked and four belt conveyor sections 12–15 for transporting the panels. The elevator 10 is provided with a V-pusher member 16 which is reciprocated by an air cylinder or any other suitable means to eject the panels one at a time and the elevator is of the type which will index upward, under control of a photosensor or the like, as each panel is ejected to bring another panel in position to be fed.

The first conveyor section 12 comprises a pair of rotatable rolls 17 and 18 which extend across the width of the machine and which have a pair of relatively narrow conveyor belts 19 wound around them. The belts may be adjusted along the rolls to accommodate different width panels. This conveyor section is motor driven and is continuously running during operation of the machine and it feeds each panel to the second belt conveyor station 13. The second belt conveyor station comprises motor driven continuously running rotatable rolls 20, 21 and 22 which extend across the machine and on which a pair of narrow belts 23 are wound and which are adjustable along the rolls. A belt tightener roller 24 is provided and this conveyor section feeds the panels through IR lamp heater sections 25 and 26 which heat the top and bottom surfaces of the panels. The second conveyor section also includes a commercially available sensor air switch 27. Switch 27 comprises an air sending nozzle 28 and an air receiving nozzle 29 and the switch includes a diaphragm and a microswitch (not shown), such that, when a panel is between and blocks the sensor, its microswitch is open and, when there is no panel between the sensor, its microswitch is closed.

The panels are fed from the second conveyor section 13 to the third conveyor section 14 which in, similar fashion, includes two continuously motor driven rolls 30 and 31 around which are wound two narrow adjustable belts 32. This section includes a pair of sensor air switches 33 and 34. Switch 33 has the air sending nozzle 35 and air receiving nozzle 36 and switch 34 has the air sending nozzle 37 and air receiving nozzle 38. Similar to switch 27, these switches operate a diaphragm and microswitch. The third conveyor station 14 feeds the panels to the resist web applying and severing apparatus. This apparatus comprises upper and lower vacuum bails 39, upper and lower vacuum shoes 40, upper and lower rotating cutter blades 41, and upper and lower apply rolls 42. Associated with the vacuum bails and cutter blades are conventional reed or microswitches 43, 44, 45 and 46. The resist web applying and severing apparatus will be described in detail later on.

From the resist web applying and severing apparatus, the panels are fed to conveyor section 15 which includes two continuously motor driven rolls 47 and 48 around which are wound two narrow adjustable belts 49. This section also includes a pair of sensor air switches 50 and 51. Switch 50 has the air sending nozzle 52 and air receiving nozzle 53 and switch 51 has the air sending nozzle 54 and air receiving nozzle 55. As in the case of the aforementioned sensor air switches, these switches operate a diaphragm and microswitch. Conveyor section 15 feeds the panels onto any suitable type of gravity drop station.

In the sequence of operation of feeding the panels through the conveyor system, a switch on a conventional electrical console is placed in automatic mode and power is applied to start the four conveyor sections 12–15 running. A supply of panels are loaded into the input elevator 10 and an auto start switch on the elevator is activated which will cause the elevator to index up to the first panel position. Upon reaching this position, the V-pusher member 16 will extend and eject the first panel onto the first conveyor section 12. As the panel travels on conveyor 12 and on to the second conveyor section 13, sensor air switch 27 is closed and re-opened as the trailing edge of the panel clears the switch. This will initiate a signal which will cause the elevator pusher member to eject a second panel onto the first conveyor section 12. These panels will continue to run on the conveyor section 13 and both sides will be heated to a pre-set temperature by the IR lamp heater sections 25 and 26.

The heated panels will continue on to the third conveyor section 14 which runs at a faster speed than the second conveyor section 13, until the first panel closes and reopens the sensor air switch 33 which will initiate a signal to stop the conveyor section 14 and to operate the vacuum bails. While conveyor section 14 is stopped, the two vacuum bails 39 will actuate toward the panel, in a manner to be described, to apply the leading edge of resist webs 56 and 57 to both sides of the panel. As the upper bail 39 moves down, it will actuate the microswitch 46 to start a short time delay to ensure the adhesion of the resist to the panel. A second electrical signal will also signal a pair of web tensioning cylinders 58 to let out web slack. Upon completion of the time delay, the vacuum bails will restore to their normal position and the microswitch 45 will be actuated to set up an interlock to ensure that the cutter mechanisms 41 will not operate at this time. Also, during the restoration of the upper vacuum bail 39, microswitch 46 will be actuated to restart the third conveyor section 14.

The panel with the resist material attached is fed further on conveyor section 14 and the sensor air switch 34, which had been blocked or closed by the panel, will be opened when the trailing edge of the panel passes beyond it and signal will be initiated to cause the two revolving apply rolls 42 to close and seal the resist material on to the top and bottom surfaces of the panel. The panel will now pass on to the fourth conveyor section 15 and continue until the leading edge of the panel blocks or closes the sensor air switch 50. This will initiate a signal which will cause the apply rolls 42 to stop, the conveyor section 15 to stop, and the cutter mechanisms 41 to operate, in a manner to be described, to shear the webs. The upper cutter mechanism will actuate either microswitch 43 or 44 depending on which direction it travels across the web to acknowledge that a cutting operation took place. A signal from either microswitch 43 or 44 will restart the apply rolls 42 and the conveyor section 15 to feed the panel past the sensor air switch 51 which will initiate a signal to reopen the two apply rolls 42. The finished panel will now continue on to a suitable gravity drop station and the sequence continues for the following panels.

Figure 2:
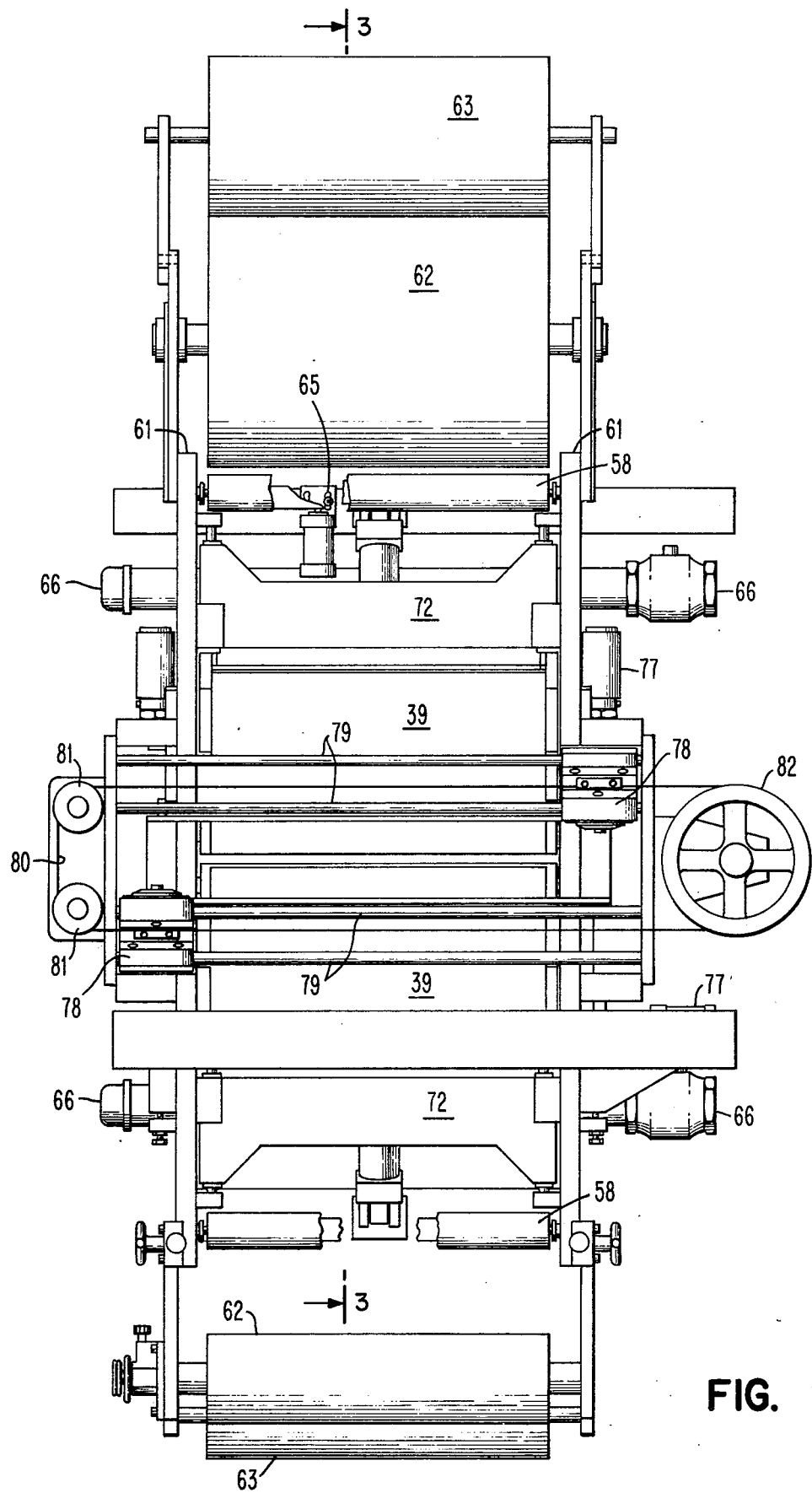
FIG. 2 is an elevation view across the machine showing the web applying and cutting station.

Referring now to FIGS. 2 and 3, there is shown the web applying and cutting station. As shown more particularly in FIG. 3, the station comprises an upper section 59 for operating on the top surface of the panels and a lower section 60 for operating on the bottom surface of the panels. Both the upper and lower sections are identical in structure and therefore the same reference numerals will be put on corresponding parts in both sections. The various mechanisms are mounted on a pair of support plates 61, there being one plate on each side of the machine.

Journaled between the support plates are the web supply rolls 62 for the upper and lower webs 56 and 57 and a pair of take-up rolls 63. The webs are of three ply laminate construction having an outer layer of polyethylene, a middle layer of photoresist material, and an outer layer of mylar. The take-up rolls 63 are used to remove the polyethylene from the photoresist and mylar. Adjacent the supply rolls are the web tensioning cylinders 58 which are mounted on pivot arms 64 journaled in the support plates. The pivot arms are operated by air cylinders 65, one of which is shown in FIG. 2. The tensioning cylinders are made of steel but if desired they could be made of a static remover material.

The upper and lower vacuum bails 39 for attaching the leading edge of the webs to the panels are steel with a teflon coating and they are provided with perforations to allow the vacuum to hold the web. Vacuum is supplied to the bails, as well as other vacuum components, by means of suitable tubing connected to vacuum manifold pipes 66. Each bail is provided with a curved nose section 67 which is also teflon coated steel with vacuum perforations. A rubber insert 68 extends slightly beyond each nose section for sealing the web edge against the panel surface.

The vacuum bails 39 extend across the machine and are journaled at each end to a pivot pin 69 by a suitable bearing block, not shown. Each pivot pin 69 is fastened to a support slide member 70 which is slideably mounted on a stationary shaft 71 by means of a ball bushing support member 72. The vacuum bails are each connected to an air cylinder 73 and the travel path of the bail outwardly and toward the panel being processed in controlled by rotatable cam followers, not shown, which are mounted on the bails and which follow the internal cam surface of cam blocks 74 attached to the support plates 61.

Located near the nose section of each vacuum bail and extending across the machine is a stationary vacuum bar 75 having a long vacuum slot which functions to collect any loose debris during the cutting operation. Adjacent each vacuum bar and extending across the machine is a stationary cutter bar 76 against which the cutter blades 41 operate, as will be described. Extending across the machine and from each cutter bar to the panel transport path are the vacuum shoes 40 which have a curved perforated teflon surface for controlling the trailing edge of the cut web. Adjacent the vacuum shoes are the rubber apply rolls 42. These apply rolls are motor driven and they are mounted on dove-tail slides which are operated by air cylinders 77 (FIG. 2) to open and close the rolls. The lower apply roll is driven upward to a fixed point and the upper apply roll is driven down to meet the lower one. The fixed point location may be adjusted.

Referring to FIG. 2, the upper and lower web cutting mechanisms 78 are positioned one on each side of the machine and normally out of the web paths. Each mechanism is slideably mounted on stationary shafts 79 which extend across the machine and both mechanisms are connected to a pulley cable which is wound around two pulleys 81 and a larger drive pulley 82. Any suitable drive means, such as an air cylinder and gear arrangement, may be used to rotate the drive pulley in both directions whereby the cutter mechanisms will be reciprocated back and forth across the machine to shear the webs.

Both cutter mechanisms are identical in structure and the details of one are shown in FIG. 4. The mechanism comprises a rotatable drive capston 83 having a V-notch portion which fits against the lower stationary shaft 79 such that the capstan is rotated as it moves along the shaft when the cutter mechanism is driven across the machine. The drive capstan bears against and rotates the cutter blade assembly 41 mounted on cutter arbor 84. A spring 85 pulls the blade assembly up so that cutter blade 41 bears against the bottom surface edge of cutter bar 76. Also, the cutter blade 41 turns at a faster rate than it moves linearly along the shaft to clamp the web against the cutter bar surface to get a better shearing action.

In the sequence of operation of the machine, the upper and lower web rolls are loaded on their respective supply spindles and the outer polyethylene release layers are wound on the take-up spindles leaving the photoresist and mylar layers. As the photoresist is being used, the release layer will be continually wound up on the take-up spindle.

Next a length of each web is manually pulled from the supply rolls and positioned so as to cover their associated tension roll 58, vacuum bail 39, vacuum bar 75 and vacuum shoe 40. The vacuum supply is turned on to hold the extended webs against these members. While the extended webs are vacuum held, the cutter mechanisms 78 are actuated to provide the initial clean end cuts needed for the first cycle. The vacuum slots in the vacuum bars 75 will collect any loose debris during the cutting operation. After cutting, the web scrap pieces extending over the vacuum shoes 40 are manually removed. This is only done on the first cycle. The webs are now in the position shown in FIG. 3 with their leading ends being held by the vacuum bars 75.

The machine is now ready to go into an automatic mode and the gated conveyor system is put into operation to start feeding panels and control the operation of the machine in the manner previously described.

Referring to FIG. 3, when the sensor air switch 33 initiates operation of the bail mechanism air cylinders 73, both bails will be put into motion and guided by their cam blocks 74. The upper bail 39 will first pivot counterclockwise to a vertical position and the leading edge of upper web 56 will be wrapped around the curved vacuum nose 67 and rubber insert 68 of the bail. Simultaneously, the lower bail 39 will pivot clockwise to a vertical position and the leading edge of lower web 57 will be wrapped around the curved vacuum nose 67 and rubber insert 68 of the lower bail. Then both bails and their support slides 70 will move in a straight line until the bails come into contact with the top and bottom surfaces of a panel and the rubber inserts 68 seal the leading edges of webs 56 and 57 thereto. At this point and with the vacuum still holding, the web tension rolls 58 will be pivoted toward their respective supply rolls and then returned back to their normal position to provide slack web material whereby the mass of the web supply rolls is overcome when the panel moves with the leading edges of the webs attached. After the short time delay, the vacuum in the bails 39 is turned off but it is left on in the nose sections 67 and the bails are returned back to the normal position shown in FIG. 3.

Microswitch 46 now starts conveyor section 14 and the panel with the leading edges of the webs attached will be carried forward and when sensor air switch 34 is actuated, the revolving apply rolls 42 will close and the turning rolls will seal the photoresist to the panel. The panel continues forward until sensor switch 50 is actuated to cause the apply rolls to stop turning, conveyor section 15 to stop, vacuum to be re-applied to the vacuum bails, and the cutter mechanisms 78 to operate to shear the webs. Depending on the directions of travel of the cutter mechanisms, a signal from either microswitch 43 or 44 will restart the apply rolls and conveyor 15 to feed the panel past the sensor air switch 51 which will initiate a signal to reopen the two apply rolls. The finished panel will continue on to a suitable gravity drop station and the sequence just described is repeated for the following panels.

It should be noted that after the webs are cut, the trailing edges of the cut sheets are pulled around the curved vacuum shoes 40 and the shoes prevent the trailing edges of the sheets from dropping or contacting the panel prematurely and, in effect, they lay the trailing edges onto the panel to prevent wrinkling of the sheets.

Another important feature of the present invention is that not only can the entire panel be laminated but any portion or selected areas of the panel can be laminated by adjusting the position of the sensor air switches 33 and 50 along the travel path of the panels. Looking at FIG. 1, assume that switches 33 and 50 are positioned so that the leading edges of the webs are sealed even with the leading edge of the panel and, after cutting, the trailing edges of the cut sheets are sealed even with the trailing edges of the panel. It can be seen that if switch 33 is positioned a certain distance toward the left, the leading edges of the webs will be sealed a corresponding distance in from the leading edge of the panel. Also, if switch 50 is moved a certain distance to the right, the sheets will be cut shorter by an amount corresponding to this distance. And, of course, the reverse is true. Positioning switch 33 toward the right will provide sealing against the leading edge of a longer panel and positioning switch 50 to the left will result in longer cut sheets. Thus, the apparatus is readily adjustable to process panels of different lengths.

It will be understood that if it is desired to apply a sheet of material to only one side of a panel, this may be accomplished by either removing one of the web supply rolls and operating the entire machine or by suitably disabling either the top or bottom section of the machine and operating only one section. In the case where only one section and therefore only one vacuum bail mechanism is operated, it may be necessary to provide a suitable buffer or support plate between conveyor sections 14 and 15 to support a thin panel against the impact of the vacuum bail.

While the invention has been particularly shown and described with reference to a preferred embodiment thereof, it will be understood by those skilled in the art that various changes in form and details may be made therein without departing from the spirit and scope of the invention.

What is claimed is:
1. A laminator for applying at least one sheet of material cut from a supply web to one side of a panel which comprises;
    a vacuum bail for holding the leading portion of a supply web of material;
    first feed means for feeding a panel and stopping it in a position opposite said vacuum bail;
    means for operating said vacuum bail toward and away from said panel to press seal the leading edge of the web to one side of the panel;
    rotating apply roll means;
    means for operating said first feed means to feed the panel with the edge of the web attached past said apply roll means to press seal an additional length of the web to one side of the panel as said panel pulls the web;
    second feed means for feeding the panel from said apply roll means and first feed means;
    means for stopping said second feed means and the rotation of said apply roll means and the panel to stop the press sealing of said additional length of web;
    a rotatable cutter blade mechanism movable across the width of the web;
    means responsive to the stopping of said second feed means and apply roll means for operating said cutter mechanism to shear a length of material from the web; and
    means responsive at the completion of said shearing operation to restart operation of said second feed means and said apply roll means to complete press sealing of the cut length of web material to the panel.

2. A laminator as set forth in claim 1 and including vacuum removal means associated with said cutter blade mechanism for removing any debris caused by the shearing of the web.

3. A laminator as set forth in claim 1 and including a curved perforated vacuum shoe arranged between the end of the bail and the apply roll means and around which the cut sheet is pulled during the apply operation, said shoe being effective to prevent the trailing portion of the sheet from coming into premature contact with the surface of the panel and effectively lays the trailing edge of the sheet onto the panel to prevent wrinkling of the sheet.

4. A laminator for applying at least one sheet of material cut from a supply web to one side of a panel which comprises;
- a vacuum bail for holding the leading portion of a supply web of material;
- a first intermittently driven conveyor on one side of said vacuum bail for feeding a panel past the bail;
- intermittently driven rotating apply roll means on the other side of said vacuum bail;
- a second intermittently driven conveyor spaced from said apply roll means for receiving a panel therefrom;
- first sensor switch means associated with said first conveyor and effective upon the passage of a panel to stop said first conveyor to position a panel opposite said vacuum bail;
- means responsive to said first sensor switch means for operating said vacuum bail toward and away from said positioned panel to press seal the leading edge of the web to one side of the panel;
- switch means actuated by the restoration of the bail away from the panel for initiating the restart of said first conveyor to feed a panel with the edge of the web attached thereto past said rotating apply roll means and onto said second conveyor to press seal an additional length of the web to the side of the panel as said panel pulls the web;
- second sensor switch means associated with said second conveyor and effective upon sensing the leading edge of a panel to stop said second conveyor and the rotation of the apply roll means and the panel to stop the press sealing of said additional length of web;
- a rotatable cutter blade mechanism movable across the width of the web;
- means responsive to said second sensor switch for operating said cutter mechanism to shear a length of material from the web; and
- switch means actuated upon the completion of said shearing operation to restart operation of said second conveyor and said apply roll means to complete press sealing of the cut length of web material to the panel.

* * * * *